United States Patent
Yoon (10) Patent No.: US 8,814,030 B2
(45) Date of Patent: Aug. 26, 2014

(54) IMPROVEMENTS OF LONG TERM BONDLINE RELIABILITY OF POWER ELECTRONICS OPERATING AT HIGH TEMPERATURES

(71) Applicant: Sang Won Yoon, Ann Arbor, MI (US)

(72) Inventor: Sang Won Yoon, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 16 days.

(21) Appl. No.: 13/723,055

(22) Filed: Dec. 20, 2012

(65) Prior Publication Data

US 2013/0270327 A1    Oct. 17, 2013

Related U.S. Application Data

(63) Continuation-in-part of application No. 13/448,632, filed on Apr. 17, 2012.

(51) Int. Cl.
*B23K 31/02* (2006.01)
*B23K 20/16* (2006.01)

(52) U.S. Cl.
CPC ............... *B23K 31/02* (2013.01); *B23K 20/16* (2013.01)

USPC .......................................... 228/234.1; 228/246

(58) Field of Classification Search
None
See application file for complete search history.

(56) References Cited

U.S. PATENT DOCUMENTS

| | | | | |
|---|---|---|---|---|
| 5,372,298 A | * | 12/1994 | Glaeser | 228/195 |
| 5,997,708 A | * | 12/1999 | Craig | 204/601 |
| 7,628,309 B1 | * | 12/2009 | Eriksen et al. | 228/194 |
| 7,659,614 B2 | * | 2/2010 | Mehrotra | 257/705 |
| 2012/0112201 A1 | * | 5/2012 | Otsuka et al. | 257/76 |

FOREIGN PATENT DOCUMENTS

JP    2007189154 A   *   7/2007

* cited by examiner

*Primary Examiner* — Kevin P Kerns
*Assistant Examiner* — Jacky Yuen
(74) *Attorney, Agent, or Firm* — Snell & Wilmer LLP (57) ABSTRACT

Alloy formation systems and methods and a mechanism, strategy and design for power electronics having high operating temperatures. The system creates a bondline targeted for performance in power electronics. The system provides for sequential alloy growth in high temperature operating power electronics. The system is at least applicable to wafer-to-wafer, die-to-wafer, die-to-substrate, or die-to-die bonding.

20 Claims, 6 Drawing Sheets

IMPROVEMENTS OF LONG TERM BONDLINE RELIABILITY OF POWER ELECTRONICS OPERATING AT HIGH TEMPERATURES

RELATED APPLICATIONS

This application is a continuation-in-part of U.S. patent application Ser. No. 13/448,632, entitled "ALLOY FORMATION CONTROL OF TRANSIENT LIQUID PHASE BONDING," filed on Apr. 17, 2012, which is assigned to the assignee hereof and hereby expressly incorporated by reference herein.

BACKGROUND

1. Field

The present disclosure relates to alloy formation, and more particularly, a mechanism, strategy and design for power electronics having high operating temperatures.

2. Description of the Related Art

Automobiles and the elements and subsystems within, require highly reliable couplings. An emphasis on the electrical properties of welds and the characteristics of the any alloys in the bonds has not been a primary focus in the industry.

Transient liquid phase bonding may be an effective approach for bonds in high power semiconductor devices. In some transient liquid phase materials, multiple A+B alloys may generate multiple compounds leading to a non-homogeneous bondline. Historically, this non-homogenous bondline is often considered to be non-ideal because of its non-uniformity, inconsistency, uncontrollability, and unpredictable quality, which may present problems for production.

SUMMARY

The above needs as well as others are successfully met via the disclosed systems and methods. The present disclosure is generally directed to control of alloy formation and control of suppression of malfunction/damage. In various embodiments, a technology (e.g., systems and methods) to improve reliability of electronic devices is disclosed. The method is especially useful for bonding technologies generating multiple compounds (or alloys).

This disclosure describes a bonding design and the sequential effect of bonded devices during high temperature operations. With this design, the undesired consequences of the use of bonded devices during high temperature operations are reduced. Stated another way, a resultant substantially homogeneous bondline made of a substantially non-homogeneous bondline which undergoes further treatment, such as exposure to heat in a power electronics device, can be achieved using the systems, methods and strategies disclosed herein. Thus, a (more) suitable bondline providing better and targeted performance for power electronics may be designed and/or achieved. The non-homogeneous bondline is converted to a homogenous bondline through consumption of the remainder first mother material and the second alloy. Stated another way, the homogenous bondline may be created due to all or substantially all of one or more alloys being consumed. Thus consumption is induced through exposure to heat, such as heat produced through operation of an electronic device.

This enables a diverse selection of fabrication techniques and creates less dependency on outside conditions and/or the need to fabricate a homogeneous bondline prior to implementation in an electronic device. This process can be used over a wide field of applications. Moreover, this strategy/design can be used on any application associated with power electronics. For instance, this system is at least applicable to wafer-to-wafer, die-to-wafer, die-to-substrate, or die-to-die bonding. Moreover, the systems, methods and designs are compatible with conventional fabrication techniques.

BRIEF DESCRIPTION OF THE DRAWINGS

The features and advantages of the embodiments of the present disclosure will become more apparent from the detailed description set forth below when taken in conjunction with the drawings. Naturally, the drawings and their associated descriptions illustrate example arrangements within the scope of the claims and do not limit the scope of the claims. Reference numbers are reused throughout the drawings to indicate correspondence between referenced elements.

FIGS. 1($a$)-1($e$) depict an exemplary process flow of transient liquid phase bonding;

FIGS. 4($a$)-4($c$) illustrate an exemplary embodiment of TLP bonding with continual alloy formation;

FIGS. 5($a$)-5($c$) illustrate damage caused by asymmetrical thickness of remainder mother material according to various exemplary embodiments.

DETAILED DESCRIPTION

In the following detailed description, numerous specific details are set forth to provide an understanding of the present disclosure. It will be apparent, however, to one ordinarily skilled in the art that elements of the present disclosure may be practiced without some of these specific details. In other instances, well-known structures and techniques have not been shown in detail to avoid unnecessarily obscuring the present disclosure.

The present disclosure is generally directed to control of alloy formation via transient liquid phase (TLP) bonding in power electronics and the changes experienced by the alloys during high power operations. TLP bonding produces joints that have microstructural and hence mechanical properties similar to those properties of the base materials. TLP bonding differs from diffusion bonding in which diffusion occurs when a melting point depressant element from an interlayer moves into lattice and grain boundaries of the substrates at the bonding temperature. Solid state diffusional processes lead to a change of composition at the bond interface as the dissimilar interlayer melt at a lower temperature than the parent materials. Thus, a thin layer of liquid spreads along the interface to form a joint at a lower temperature than the melting point of either of the parent materials. A reduction in bonding temperature leads to solidification of the melt, and this phase can subsequently be diffused away into the parent materials by holding at bonding temperature.

In various embodiments, a system and method to improve bonding quality and reliability of bonding technologies for electronic devices is disclosed. The method is especially useful for bonding technologies generating multiple compounds (or alloys).

Figure 1:
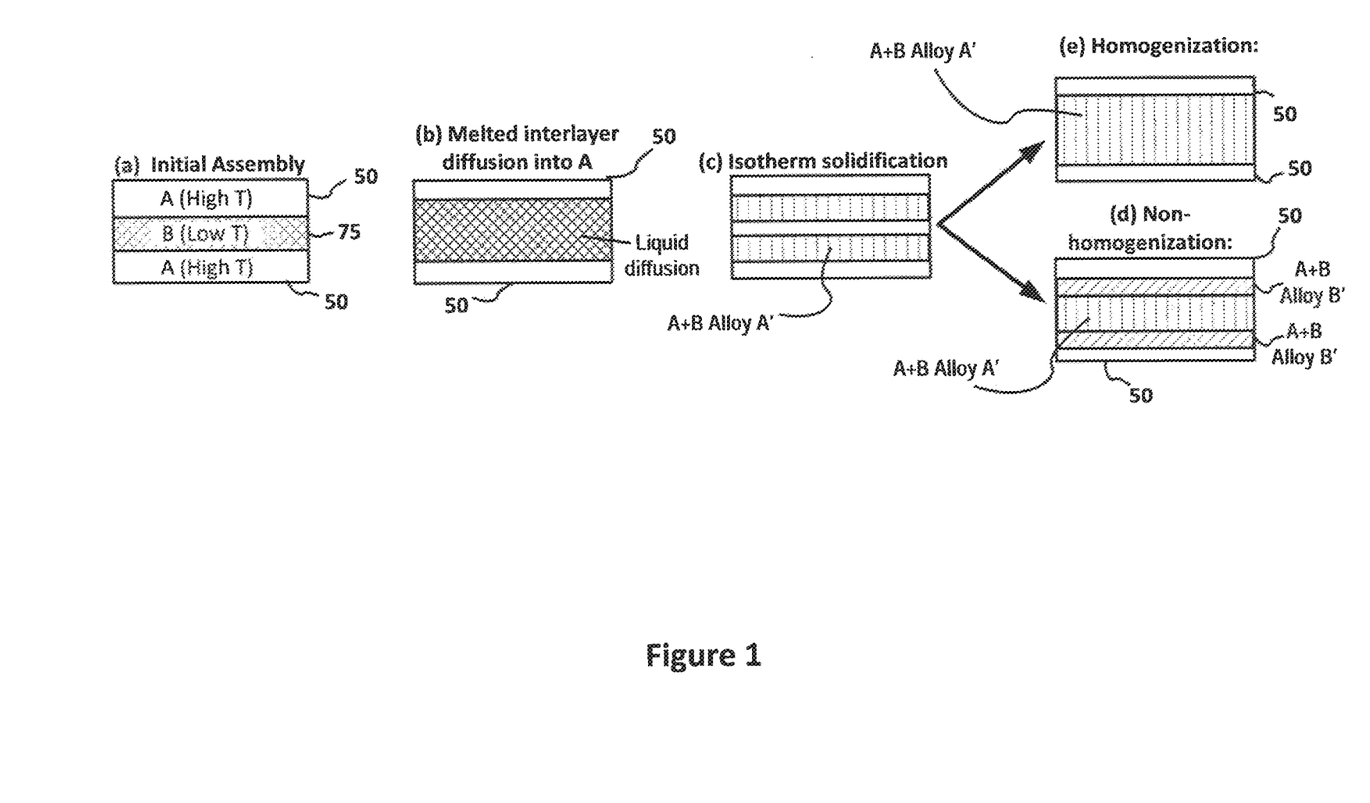

With reference to FIG. 1, the method utilizes transient liquid phase (TLP) bonding for electronics packaging. TLP bonding may be effective for high power semiconductor devices. TLP may be useful in many electronic devices, especially by high temperature power electronic devices, such as those made of silicon, SiC, GaN, etc.

An overview of the TLP bonding is illustrated in FIG. 1. In general, two (or multiple) materials are involved with the TLP bonding. As depicted, two materials denoted as material A 50 (that has a high melting temperature) and material B 75 (that has a low melting temperature with respect to the melting temperature of material A 50). It should be appreciated that both material A 50 and material B 75 need not be pure in composition. As the bonding temperature increases, the material B 75 begins to melt and diffuse into the material A 50, as shown at step (b) of FIG. 1. The diffused materials may sequentially react with the material B 75 and form an alloy via isothermal solidification. According to various embodiments, the solidification may continue until the bondline becomes an A+B alloy (A'), such as depicted in step (d) of FIG. 1 (e.g., homogeneous bondline). Mechanical pressure (such as the range of several kPa to several MPa, such as from less than about 1 kPa to about 1 MPa) may be applied during the TLP bonding process.

In some TLP materials, multiple A+B alloys may generate multiple compounds such as depicted in FIG. 1(d) leading to the non-homogeneous bondline. This non-homogeneous bondline is often considered to be non-ideal because of its non-uniformity, inconsistency, uncontrollability, and unpredictable quality, which may present problems for production. For example, copper-tin (Cu—Sn) are TLP materials that may generate multiple Cu—Sn compounds (or alloys). As both copper and tin are widely employed in power electronics materials, in various embodiments, the methods of this disclosure are configured to utilize this non-homogenous bondline in electronic devices.

In general, a particular alloy of the multiple available alloys may be more suitable for power electronics applications, due to the high power usage and high temperature generation of the power electronics, such as a conductive bondline. For example, the $Cu_3Sn$ alloy has higher electrical conductivity as compared to $Cu_6Sn_5$, even though both alloys are generated during Cu—Sn TLP bonding process ($Cu_3Sn$ corresponds to the first A–B alloy and $Cu_6Sn_5$ corresponds to the second A–B alloy). Thus, for power electronics, a target may be to utilize a process to result in a homogeneous bondline made of the preferred material (e.g., $Cu_3Sn$ alloy instead of $Cu_6Sn_5$). The above disclosed needs are successfully met via the disclosed systems and methods.

Figure 2:
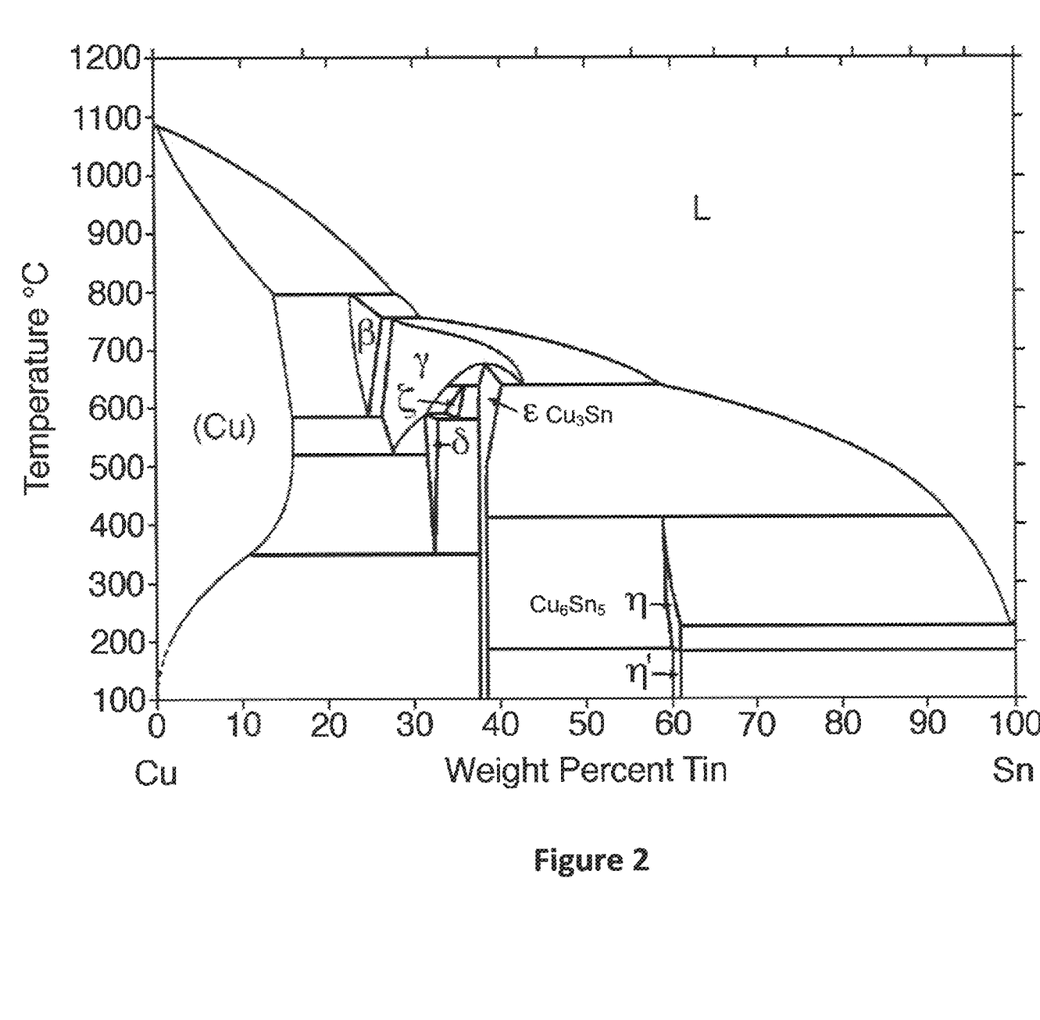
FIG. 2 depicts a phase diagram of Cu—Sn TLP bonding according to various exemplary embodiments.
Figure 3:
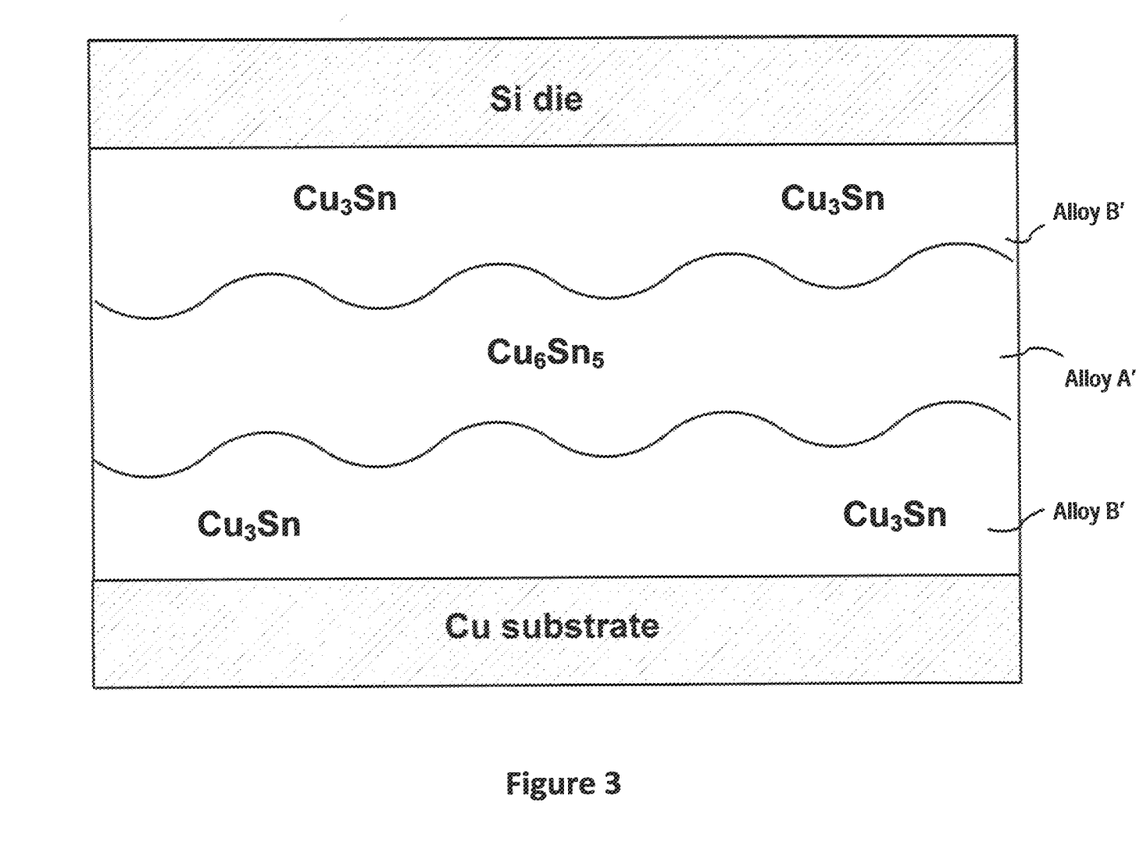
FIG. 3 depicts an exemplary embodiment of Cu—Sn TLP bonding with non-homogeneous bondlines.

Copper-tin (Cu—Sn) TLP bonding has a complicated phase diagram (shown in FIG. 2) and may generate multiple composite formations. Among Cu—Sn composites (or alloys) in the Figure, $Cu_3Sn$ (ε) and $Cu_6Sn_5$ (η) are the most frequently observed in power electronics applications. Using previous methods, the two Cu—Sn alloys may co-exist in a bondline of die attachment of power electronics, (one example such bondline is shown in FIG. 3). The bondline shown in FIG. 3 is non-homogeneous (i.e., made of multiple materials) with an ambiguous shape. The $Cu_3Sn$ alloy may be surrounded by the $Cu_6Sn_5$ alloy (FIG. 3) or sandwiched by the alloy $Cu_6Sn_5$. Bondline quality is hard to control. Several methods to produce only a $Cu_3Sn$ bondline have been attempted. One is reducing the thickness of Sn and the other is extending bonding time. However, both methods have problems. The first method (thinner Sn layer) is able to fabricate only a thin bondline, such as 1-5 μm, which experience more stress when exposed to high temperatures compared to thick bondline. The present method may produce a bondline not limited in size, such as from about 1-30 μm, or from about 5 μm to about 100 μm. The high temperature-induced stress, which is a general challenge in power electronics, increases the chance of damage at the bondline and thus thinning Sn is a limited approach. The second method (longer bonding time) can achieve a thicker bondline but requires long process time, which is inadequate for mass production. These approaches and problems are not limited to Cu—Sn, which is used as an example herein, and can be observed in materials that have a complex phase diagram and generate multiple alloys. For example, table 1 below illustrates a non-exhaustive list of additional conventional bonding materials.

TABLE 1

| Material System | Bonding Process | Remelt Temp. |
| --- | --- | --- |
| Copper - Tin | 4 min at 280° C. | >415° C. |
| Silver - Tin | 60 min at 250° C. | >600° C. |
| Silver - Indium | 120 min at 175° C. | >880° C. |
| Gold - Tin | 15 min at 260° C. | >278° C. |
| Gold - Indium | 0.5 min at 200° C. | >495° C. |
| Nickel - Tin | 6 min at 300° C. | >400° C. |

In various embodiments, the present system may be utilized to achieve a homogeneous bondline made of a single alloy. For instance, this may be accomplished through the creation of a non-homogenous bondline and through use in an electronic device with applied operational heat to create a homogenous bondline. One example alloy is $Cu_3Sn$ which is more suitable in power electronics compared to other alloys, such as $Cu_6Sn_5$. The present system may be configured to fabricate a thick bondline, which is advantageous in reducing bondline stress induced by high temperatures. Also, aiding in mass production, the present system does not require long bonding time and is less depend on fabrication conditions. For instance, the bonding process of the present system is between about 30 minutes to about 2 hours. The present system provides excellent contact and good electrical and thermal conductivity to bonded devices, and therefore, improves device performance as well as bonding quality over prior techniques.

According to various embodiments, the methods disclosed herein relate to thick non-homogeneous bondlines.

Figure 4:
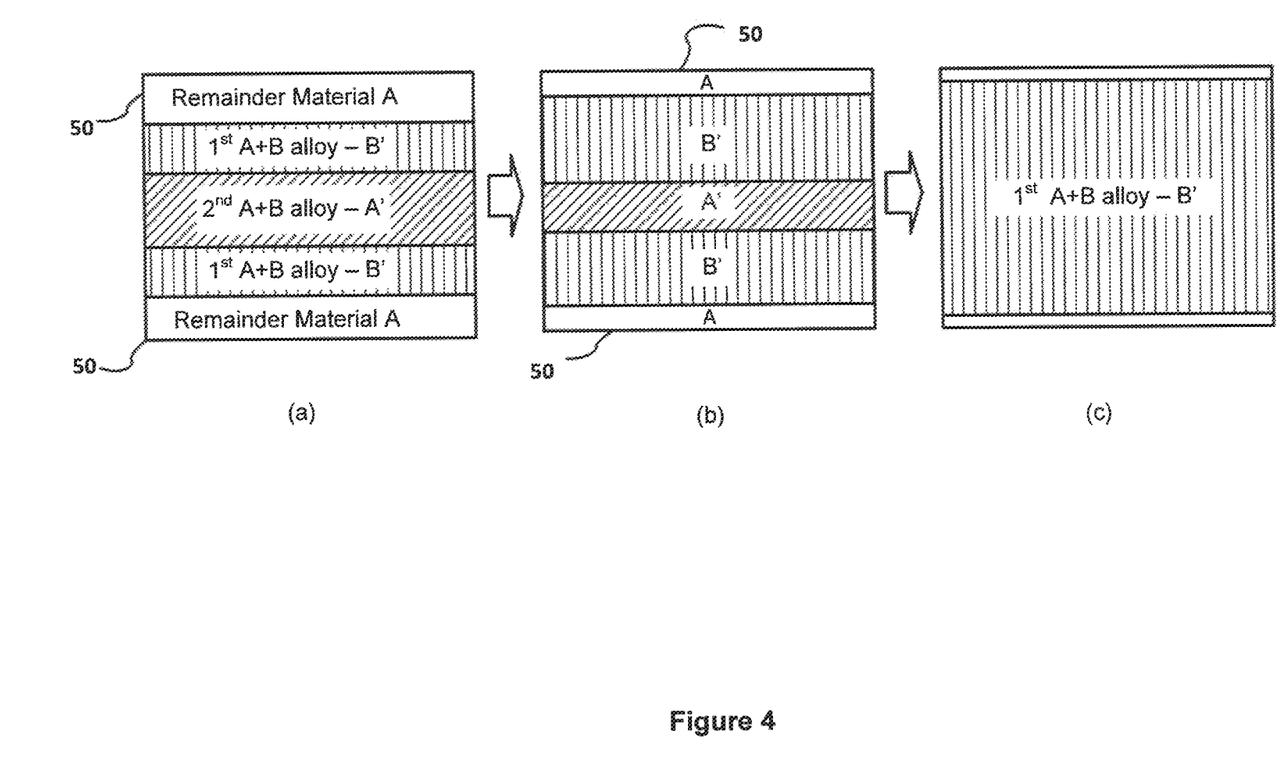

According to various embodiments and with reference to FIGS. 4(a)-4(c), the TLP bonding disclosed herein may generate multiple alloys in a sequential manner. For example, as with a Cu—Sn TLP bonding, the two alloys of Cu—Sn ($Cu_3Sn$ and $Cu_6Sn_5$) may be formed according to the following. First, Cu (material A 50 in FIG. 1) reacts with Sn (material B 75 in FIG. 1) and produces the first Cu—Sn alloy, $Cu_6Sn_5$ (material A' in FIG. 4(a)). Subsequently, the produced $Cu_6Sn_5$ (material A') reacts with left-over Cu and forms $Cu_3Sn$ (material B' in FIG. 4(a)). This process continues until all Sn is consumed and Cu—Sn TLP bonding is completed.

In various applications, power electronics operate at high temperatures in the range from greater than about 50° C. to greater than about 250° C. Thus, as time passes, the operating temperature generates a high temperature in these power electronics. This high temperature and/or heat may be continuously increasing. According to various embodiments described herein, these high operating temperatures may be configured to activate alloy formation, such as after a first round of bonding, (such as during initial fabrication of a non-homogenous bondline) is completed.

FIGS. 4(a)-4(c) depict this continual alloy formation via high temperature exposure, such as within power electronics applications. Stated another way, according to various exemplary embodiments, a portion of the continual alloy formation (FIG. 4(a) to FIG. 4(b)) occurs after the non-homogeneous bondline is formed during the bonding and assembly in a power electronic application and a portion of the continual alloy formation (FIG. 4(b) to FIG. 4(c)) occurs post implementation/assembly of the non-homogenous bondline in a power electronics applications.

As depicted, no material B 75 (Sn in a Cu—Sn TLP) is involved in FIGS. 4(a)-4(c) because it is completely consumed during the initial bonding process which creates the non-homogeneous bondline of FIG. 4(a). Alloy B' ($Cu_3Sn$ in a Cu—Sn TLP) grows by consuming left over material A 50 (Cu in a Cu—Sn TLP) and another alloy A' ($Cu_6Sn_5$ in a Cu—Sn TLP). The process continues until approximately the entire bondline is made of alloy B' leaving no alloy A' (FIG. 4(c)). The bondline is uniformly made of alloy B' (homogenous bondline) and more conductive because it is made of more $Cu_3Sn$ than $Cu_6Sn_5$ (in a Cu—Sn TLP bonding case).

Note, as stated above, this subsequent alloy B' formation is conducted during the usage of the bonded power electronics. Therefore, a resultant homogenous bondline with increased conductive properties is achieved through this method and technique by harnessing the bonded power electronics to complete the continual alloy formation. Thus, based on the various techniques disclosed herein, design of bondlines for use in power electronics and the resultant bondlines implemented in production may be made with less time, cost, equipment, and material by harnessing the heat created by the operating temperatures of the power electronics themselves.

With renewed reference to FIGS. 4(a)-4(c), progressing through FIGS. 4(a) to 4(b) to 4(c), alloy B' grows and alloy A' and "remainder" material A 50 reduces. This process does not occur without material A 50 (Cu in Cu—Sn TLP). Thus, it is important to secure sufficient material A 50 so that it does not deplete until all or substantially all of the non-homogenous bondline changes to alloy B' (as depicted in FIG. 4(c)).

Figure 5:
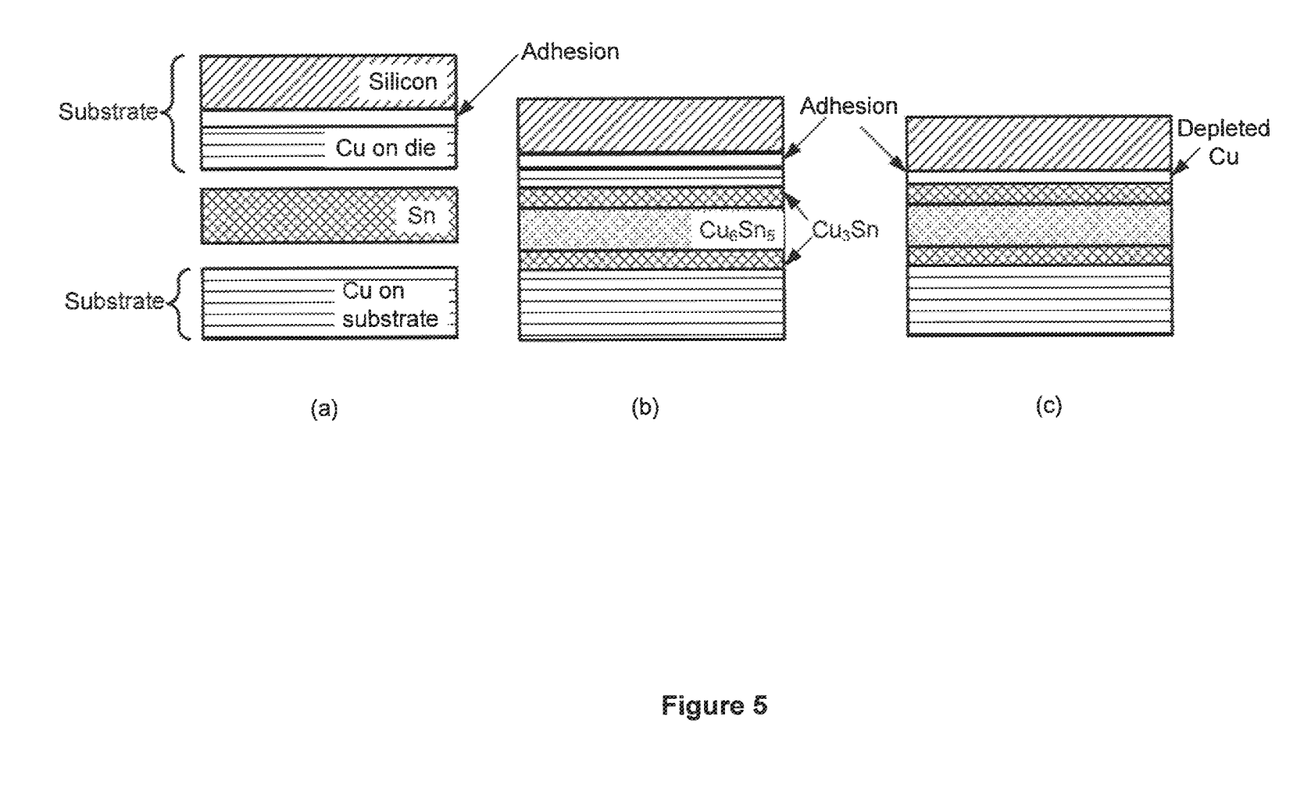
Figure 6:
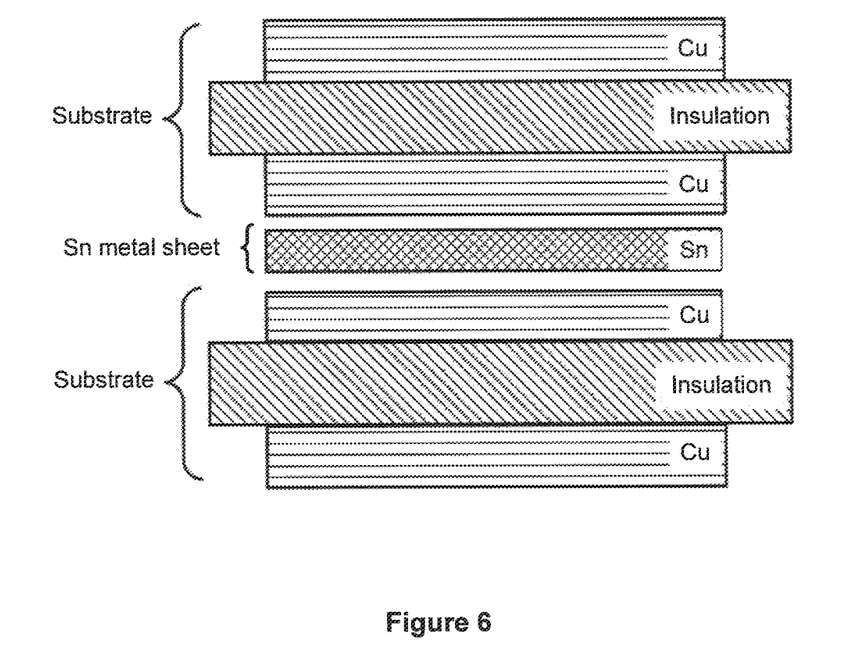
FIG. 6 illustrates an exemplary embodiment of two substrates having sufficient remainder mother material.

Developing a bondline with sufficient material A 50 has another advantage. In general, material A 50 will be softer than conventional semiconductor materials. For example, Cu has Young's modulus of 117 GPa, which is significantly smaller than those of silicon (160 GPa) or silicon carbide (300-400 GPa). Thus, the reminder material A 50 can relieve thermal-induced stress because it has a greater flexibility than the stiff semiconductor materials (shown in FIG. 6) and thus contributes as a stress-relief layer. Stated another way, as depicted, Cu in FIG. 6 functions as a stress-relief layer for the assembly. The stress-relief function is another important factor for design of high temperature power electronics. Though Cu—Sn bonding materials are depicted in FIGS. 5 and 6, any set of bonding materials may be used in their place, such as those listed in Table 1.

According to various exemplary embodiments, the initial material A 50, and volume thereof should be designed considering several factors. As shown in FIG. 5(a), many power electronics structures have asymmetric thickness of mother material A 50 on the die versus on the substrate. For example, Cu on a silicon die or a silicon carbide die will, in general, be much thinner than Cu on substrates (FIG. 5(a)). Thus, after the bonding is completed (FIG. 5(b)) and the bonded power electronics operate, the $Cu_3Sn$ grows consuming $Cu_6Sn_5$ and remainder Cu. Note historically, Cu on the die side may be depleted while Cu on the substrate side still exists. The depletion directly contacts the grown $Cu_3Sn$ to adhesion layer (initially underneath initial Cu layer) and results in weak adhesion (see FIG. 5(b)). The weak adhesion induces delamination and/or cracks at the interface between the $Cu_3Sn$ and the adhesion layer (see FIG. 5(c)).

Also note that the growth rate can differ by operating conditions, such as temperatures, and the quality and the dimensions of Cu and Sn layers. At high temperatures, the growth occurs much faster. This may lead to early Cu depletion, if the total amount of Cu is not sufficient. Any one of the various methods to deposit/pattern Cu and Sn (electroplating, sputtering, evaporating, etc.) may be used. Different deposition methods result in different grain size and thus a different growth rate. Thus, based on the deposition methods planned to be utilized, the initial amount of material A 50 may be altered.

As stated above, sufficient amount of material A 50, such as Cu, should be deposited to guard against depletion. For instance, thick Cu layers on both sides may be employed to guard against depletion. As shown in FIG. 6, two substrates having sufficient (and according to various embodiments symmetric and/or substantially symmetrical) Cu layers are Cu—Sn TLP bonded. According to various embodiments, the amount of material A 50 on either the die side or the substrate side are not consumed prior to alloy A' being consumed. The resultant bondline is homogenously made of $Cu_3Sn$. Using this methodology, no sign of damage or delamination is observed.

This disclosure describes a mechanism for high temperature operating power electronics bonded by transient liquid phase (TLP) bonding. A sequential mechanism activated by high temperature generated during the usage of bonded power electronics (after the initial bonding) is disclosed. The high temperatures and configuration of the materials induce subsequent growth of one of the multiple alloys, which grows by consuming left-over/remainder mother materials (Cu in a Cu—Sn TLP) and other alloys ($Cu_6Sn_5$ in a Cu—Sn TLP). This process continues until the bondline (and/or substantially all of the bondline) is made of the single alloy or until the left-over mother material is depleted. According to various embodiments, the amount of the remainder mother material may be selected such that the remainder mother material is not consumed prior to the second alloy being consumed. The former case (e.g., homogenous bondline and/or substantially homogenous bondline) may provide a more uniform, consistent, reliable bondline with highly manageable process control as compared with a non-homogenous bondline. The latter case (depleted material) may lead to weak adhesion between the grown alloy and initial materials leading to degradation and/or damage. Thus, securing sufficient mother materials ensures the best possible results for a stable power electronics structure. Securing sufficient mother materials results in a non-depleted material scenario. Additionally, having sufficient mother materials can contribute as a stress-relief layer.

Therefore, sequential alloy growth (after the bonding is complete) of power electronics at high temperature operation using the process described herein results in stronger and more predictable bondlines. Without this process, using the conventional techniques may result in uncontrollable bondlines or those that experience degradation/damage. One design factor is the initial thickness of mother materials (Cu in Cu—Sn TLP bonding). For instance, to make the bondline using $Cu_3Sn$, the initial Cu should be at least about 1.05 times thicker than the total Sn thickness. However, in general, because of traditional power electronics structures, Cu on die side is generally much thinner than the Cu on the substrate side. Therefore, even though the total Cu thickness (of die and substrate sides) is more than about 1.05 times of the sandwiched Sn, the Cu on die side may be depleted before all bondline transforms to $Cu_3Sn$. Thus, it is important to consider the bi-directional alloy formation and securing a sufficient die-side Cu thickness. For instance, a die side thickness of at least 0.525 times the sandwiched Sn and a substrate side thickness of at least 0.525 times the sandwiched Sn. Also, it should be considered that the growth rate may differ due to operational conditions (e.g., temperature) and quality/dimension of the Cu and the Sn layers.

Multiple structures and fabrication options are proposed. Various materials may be used. Also, a pre-treatment of a material surface may be performed. This variety enables a flexible design and fabrication process and easy translation of this technology to many applications. For instance, this system and method may be applied to wafer-to-wafer, die-to-wafer, die-to-substrate, or die-to-die bonding. Also, the presently disclosed technology is compatible with conventional fabrication techniques.

A system using a Cu—Sn is disclosed; however, an analogous method can be used in other two-material TLP bonding that generates multiple alloys (such as those disclosed in Table 1). For example the first material, material A 50 and the second material, material B 75, may comprise any of copper, tin, silver, indium, gold, nickel, and/or boron. The two most common alloys of Cu—Sn are $Cu_3Sn$ and $Cu_6Sn_5$.

The methods disclosed herein have the advantage that they do not depend on fabrication of a homogeneous bondline. For instance, prior techniques to fabricate a homogeneous bondline prior to implementation in a power electronic device were costly and specialized to achieve a precise homogenous bondline. However, the present technique does not require a homogeneous bondline prior to implementation in a power electronic device. In fact, according to various embodiments, the present technique desires the opposite, a non-homogeneous bondline prior to implementation in a power electronic device. In power electronics, a bondline proving high electrical conductivity is beneficial, $Cu_3Sn$ has higher electrical conductivity than $Cu_6Sn_5$ and thus is generally better suited for power electronics. Stated another way, the techniques disclosed herein eventually create a bondline made of substantially only $Cu_3Sn$ without $Cu_6Sn_5$ which is well suited for power electronics applications. FIGS. 4(a)-4(c) illustrates the transition from the multiple-alloy bondline to a single alloy bondline with high suitability for power electronics. The methods disclosed herein are at least applicable to the automotive, watercraft, aerospace, nuclear, and/or electronics industries. Additionally, the methods disclosed herein are at least applicable to hybrid, plug-in hybrid, and/or electric vehicles.

This system is highly adaptable as various structures and fabrication options may be implemented. This enables less dependency on fabrication conditions. This process can be used over a wide field of applications. For instance, this process can be used on any application associated with power electronics. For instance, this system is applicable to wafer-to-wafer, die-to-wafer, die-to-substrate, or die-to-die bonding. Moreover, this system is compatible with conventional fabrication techniques.

Disclosed herein is a system for sequential alloy growth. According to various embodiments, this system comprises sandwichably positioning a second mother material between a first section of a first mother material and a second section of the first mother material. Then, via transient liquid phase bonding, creating a substantially nonhomogeneous bondline of a first alloy material and a second alloy material from the first mother material and the second mother material. The created substantially nonhomogeneous bondline is integral to a power electronics device. Next, a substantially homogeneous bondline of the first alloy material is created from the substantially nonhomogeneous bondline via inducing subsequent growth of the first alloy material by exposing the substantially nonhomogeneous bondline to heat from operation of the power electronics device. Stated another way, by exposing the substantially nonhomogeneous bondline to heat from operation of the power electronics device at least one of a remainder mother material and the second alloy material is consumed resulting in a homogeneous bondline.

Those of ordinary skill will appreciate that the various illustrative logical blocks and process steps described in connection with the examples disclosed herein may be implemented as electronic hardware, computer software, or combinations of both. Whether such functionality is implemented as hardware or software depends upon the particular application and design constraints imposed on the overall system. Ordinarily skilled artisans may implement the described functionality in varying ways for each particular application, but such implementation decisions should not be interpreted as causing a departure from the scope of the disclosed apparatus and methods.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example embodiments is provided to enable any person of ordinary skill in the art to make or use the present invention. Various modifications to these examples will be readily apparent to those of ordinary skill in the art, and the principles disclosed herein may be applied to other examples without departing from the spirit or scope of the present invention. The described embodiments are to be considered in all respects only as illustrative and not restrictive and the scope of the invention is, therefore, indicated by the following claims rather than by the foregoing description. All changes which come within the meaning and range of equivalency of the claims are to be embraced within their scope.

What is claimed is:

1. A sequential alloy growth method comprising:
   implementing a nonhomogeneous bondline in an assembly, the nonhomogeneous bondline formed using a heat source for transient liquid phase bonding of a first mother material and a second mother material resulting in a first alloy, a second alloy and remainder first mother material, wherein the second mother material is consumed during the bonding process;
   completing an implementation of the assembly for an electronic device; and
   inducing subsequent growth of the first alloy by consuming at least one of the remainder first mother material or the second alloy by exposing the assembly to operational heat from the electronic device, which is different from heat from the heat source.

2. The sequential alloy growth method of claim 1, further comprising sandwichably positioning the second mother material between a first section of the first mother material and a second section of the first mother material.

3. The sequential alloy growth method of claim 1, wherein an amount of the remainder first mother material is selected such that the remainder first mother material is not consumed prior to the second alloy being consumed.

4. The sequential alloy growth method of claim 2, wherein the first section of the first mother material is on a die, the second section of the first mother material is on a substrate, and the first section of the first mother material and the second section of the first mother material are substantially symmetrical.

5. The sequential alloy growth method of claim 1, wherein a resultant bondline is between about 5 µm to about 100 µm.

6. The sequential alloy growth method of claim 1, wherein the operational heat is provided through power electronic operation post fabrication of a power electronic device comprising the assembly.

7. The sequential alloy growth method of claim 4, wherein a thickness of the first section of the first mother material is at least 0.525 times a thickness of the second mother material and a thickness of the second section of the first mother material is at least 0.525 times the thickness of the second mother material.

8. The sequential alloy growth method of claim 1, wherein electroplating, sputtering, or evaporating may be used to deposit at least one of the first mother material or the second mother material.

9. The sequential alloy growth method of claim 1, wherein the remainder first mother material is configured to function as a stress-relief layer.

10. The sequential alloy growth method of claim 1, wherein the assembly is a power electronics assembly.

11. The sequential alloy growth method of claim 10, wherein an operation of the power electronics assembly produce the heat in a range of greater than about 50° C. to about 250° C.

12. The sequential alloy growth method of claim 1, wherein the nonhomogeneous bondline is converted to a homogenous bondline through operation of a power electronic device comprising the nonhomogeneous bondline.

13. The sequential alloy growth method of claim 1, wherein the first alloy selected is based on conductive properties of the first alloy.

14. The sequential alloy growth method of claim 1, wherein at least one of the first mother material or the second mother material comprises a material selected from copper, tin, silver, indium, gold, nickel or boron.

15. The sequential alloy growth method of claim 1, wherein the nonhomogeneous bondline is converted to a homogenous bondline through consumption of the remainder first mother material and the second alloy.

16. The sequential alloy growth method of claim 1, wherein the bonding process is between about 30 minutes to about 2 hours.

17. The sequential alloy growth method of claim 1, wherein the method is used for creation of power electronics.

18. The sequential alloy growth method of claim 1, wherein the method is used for at least one of hybrid, plug-in hybrid or electric vehicles.

19. A method for producing a power electronics device comprising:
   creating a substantially nonhomogeneous bondline of a first alloy material and a second alloy material via transient liquid phase bonding before the power electronics device is operational;
   producing the power electronics device comprising the created substantially nonhomogeneous bondline; and
   creating a substantially homogenous bondline of the first alloy material via consuming the second alloy material by exposing the second alloy material and a mother material to heat created from operation of the power electronics device.

20. A method for sequential alloy growth comprising:
   sandwichably positioning a second mother material between a first section of a first mother material and a second section of the first mother material;
   via transient liquid phase bonding and a heat source, creating a substantially nonhomogeneous bondline of a first alloy material and a second alloy material;
   producing a power electronics device comprising the created substantially nonhomogeneous bondline; and
   creating a substantially homogenous bondline of the first alloy material from the substantially nonhomogeneous bondline via inducing subsequent growth of the first alloy material by exposing the substantially nonhomogeneous bondline to heat from operation of the power electronics device, which is different from heat from the heat source, resulting in consumption of at least one of a remainder mother material or the second alloy material.

* * * * *